(12) United States Patent
Lee (10) Patent No.: US 7,855,896 B2
(45) Date of Patent: Dec. 21, 2010

(54) RF CIRCUIT MODULES AND INTEGRATED CHASSIS WITH POWER INTERFACE FOR RF CIRCUIT MODULES

(76) Inventor: Jay Lee, 221 Euclid Street, Whitby, Ontario (CA) LIN 5B4

( * ) Notice: Subject to any disclaimer, the term of this patent is extended or adjusted under 35 U.S.C. 154(b) by 1758 days.

(21) Appl. No.: 10/866,769

(22) Filed: Jun. 15, 2004

(65) Prior Publication Data

US 2004/0223311 A1 Nov. 11, 2004

Related U.S. Application Data

(62) Division of application No. 10/158,050, filed on May 31, 2002, now Pat. No. 6,842,348.

(51) Int. Cl.
H95K 7/14 (2006.01)
(52) U.S. Cl. .................... 361/796; 439/76.1
(58) Field of Classification Search ............... 361/796, 361/741, 752; 439/76.1
See application file for complete search history.

(56) References Cited

U.S. PATENT DOCUMENTS

| | | | |
|---|---|---|---|
| 5,010,450 | A | 4/1991 | Werdin et al. |
| 5,398,161 | A | 3/1995 | Roy |
| 5,552,962 | A | 9/1996 | Feustel et al. |
| 5,737,194 | A * | 4/1998 | Hopkins et al. ............. 361/800 |
| 5,903,829 | A | 5/1999 | Anderson et al. |
| 5,909,155 | A | 6/1999 | Anderson et al. |
| 5,926,370 | A * | 7/1999 | Cromwell .................. 361/700 |
| 5,955,930 | A | 9/1999 | Anderson et al. |
| 5,966,492 | A | 10/1999 | Bechamps et al. |
| 5,966,648 | A | 10/1999 | Ortberg et al. |
| 6,046,913 | A * | 4/2000 | Helmstetter et al. ......... 361/796 |
| 6,049,709 | A | 4/2000 | Anderson et al. |
| 6,102,214 | A | 8/2000 | Mendoza |
| 6,127,631 | A * | 10/2000 | Green et al. ............... 174/72 A |
| 6,144,561 | A | 11/2000 | Cannella, Jr. et al. |
| 6,185,109 | B1 * | 2/2001 | Koradia et al. ............. 361/818 |
| 6,186,798 | B1 * | 2/2001 | Follingstad et al. ........ 439/76.1 |
| 6,195,493 | B1 | 2/2001 | Bridges |
| 6,223,909 | B1 | 5/2001 | Mendoza |
| 6,289,210 | B1 | 9/2001 | Anderson et al. |
| 6,321,917 | B1 | 11/2001 | Mendoza |
| 6,328,608 | B1 | 12/2001 | Olson et al. |
| RE37,489 | E | 1/2002 | Anton et al. |

(Continued)

*Primary Examiner*—Tuan T Dinh
*Assistant Examiner*—Andargie M Aychillhum
(74) *Attorney, Agent, or Firm*—Brinks Hofer Gilson & Lione (57) ABSTRACT

An RF management system especially suitable for use in CATV head end environments is disclosed. The system is characterized by a basic rack-mountable chassis component that can be configured for both front and rear mount applications, for different cable management solutions and for accepting eighteen passive RF modules or nine active RF modules or a combination of passive and active RF circuit modules. The active configuration of the chassis has an integrated power bus with at least nine connectors for receiving up to nine active RF circuit modules. The active RF circuit modules, such as power supplies and amplifiers are each provided with a "floating" connector for ease in connecting the power supply module or amplifier module to the power bus. The RF power supply module is capable of supplying power to all the active RF modules in the chassis as well as to active RF modules mounted in one or more other chassis in the rack.

17 Claims, 10 Drawing Sheets

U.S. PATENT DOCUMENTS 6,361,131 B1 * 3/2002 Powell, Jr. ................ 312/312
6,396,992 B1 * 5/2002 Debal ........................ 385/135
2003/0063454 A1 * 4/2003 Wilson et al. ............... 361/796

* cited by examiner

RF CIRCUIT MODULES AND INTEGRATED CHASSIS WITH POWER INTERFACE FOR RF CIRCUIT MODULES

This application is a Division of application Ser. No. 10/158,050 Filed on May 31, 2002 now U.S. Pat. No. 6,812,348

FIELD OF THE INVENTION

The present invention relates to the field of radio-frequency (RF) management systems and more particularly to modular RF circuit components and chassis configurations for supporting and interconnecting active and passive RF circuit modules.

BACKGROUND OF THE INVENTION

In the telecommunications industry, broadband RF signals are delivered to consumers via conductors from a head end located, for example, at the central office of a CATV telecommunications company. At the head end, a variety of RF circuit modules are typically mounted in racks of specially designed chassis components. The RF modules carry out the many kinds of RF signal modifications and manipulations necessary to operate a telecommunications system, such as a CATV system. Many different types of RF circuit modules and chassis for supporting, connecting and managing the cables associated with the modules are known in the telecommunications industry.

A few examples of RF circuit modules and supporting chassis components are disclosed in U.S. Pat. Nos. 5,903,829; 5,909,155; 5,955,930; 5,966,648; 6,046,913; 6,049,709; 6,102,214; 6,144,561; 6,195,493; and 6,289,210. The versatility and flexibility of many of these prior art modules and chassis systems are limited by the number and type of modules that can be installed in the chassis, by the cable management components mounted to the chassis and by the connectibility of the various RF modules to each other and to the chassis components. For instance, many of the prior art chassis components are not capable of accepting both active RF modules (amplifiers, power supplies, RF detector switches), as well as passive RF modules (splitters, combiners, attenuators, equalizers, filters). Many prior art RF modules are provided with one type of cable connector and one form of cable management component.

Accordingly, there is a need in the art for an integrated and flexible RF management system that is particularly suited for use in CATV head end environments and that can be configured and reconfigured in a number of ways depending on the requirements of the CATV operator. There is also a need for versatile rack-mounted chassis components for the vertical and horizontal mounting of active (powered) and passive (unpowered) RF circuit modules with different cable connectors and different cable management solutions.

SUMMARY OF THE INVENTION

Accordingly, it is a principal object of the present invention to provide a versatile and flexible RF management system especially suitable for use in CATV head end environments. The inventive system is characterized by a basic rack-mountable chassis component that can be configured for both front and rear mount applications, for different cable management solutions and for accepting passive, active or a combination of passive and active RF circuit modules.

It is another object of the invention is to provide a rack-mountable chassis having an integrated power bus with a plurality of connectors for receiving active RF circuit modules.

Yet another object of the invention is to provide an active RF circuit module such as a power supply or amplifier that is provided with a floating connector for ease in connecting the power supply module or other active module to a power bus connector.

It is still another object of the invention to provide a "hot-swappable," plug-in RF power supply module that is capable of supplying power to all the active RF modules in a rack-mounted chassis as well as to the active RF modules mounted in one or more other chassis in the rack.

Yet another object of the invention is to provide a rack-mountable chassis that can accommodate 18 passive RF modules or 9 active RF modules.

Another object of the invention is to provide a simple, yet versatile chassis component with an integrated power bus for use with both active and passive RF circuit modules.

These and other objects and features of the present invention are accomplished, as embodied and fully described herein according to the invention, by an RF management system comprising a basic 5 rack unit chassis with an integrated power bus adapted for high-density mounting of up to 18 passive RF modules or 9 active RF modules or combinations of active and passive modules. The chassis can be configured for front or rear vertically mounted modules with rear or front cable access, respectively. The chassis can also be provided with different cable management structures, including cable management trays, cable management ears and cable management bars. The system also includes a one rack unit chassis for horizontal mounting of passive RF modules.

The basic chassis is of simple sheet metal construction designed for vertical mounting of RF circuit modules. The chassis comprises a pair of side walls with flanges for rack mounting. The side walls are connected by upper and lower shallow, U-shaped brackets each provided with slots along one longitudinal edge for receiving mating guide pairs on the tops and bottoms of the RF modules. If the chassis is intended to be used with active RF modules, such as a power supply or amplifier, or with both active and passive RF modules, a planar power bus with 9 connectors is mounted in the upper bracket on the side thereof confronting the lower bracket. A pair of support bars also connects the side walls to strengthen and rigidify the chassis structure.

The cable management structures are also of sheet metal construction and comprise (1) a horizontal tray mounted to the rear lower edges of the side walls in lieu of one of the lower support bar; (2) a pair of vertical plates with ears or fingers extending perpendicular thereto mounted to the vertical rear edges of the side walls; and (3) a one rack unit horizontal tray with routing slots rack-mountable below a chassis used for rear mounting.

The RF circuit modules for use with the above-described chassis include both active and passive modules. The passive modules may be provided in a variety of configurations, including 16-way splitters and combiners, 8-way splitters and combiners, 4-way splitters and combiners, dual 4-way splitters and combiners, 2-way splitters and combiners, triple 2-way splitters/combiners, directional couplers (DC), filters and equalizers. The active modules are "hot-swappable" and include power supplies in various specifications, e.g., 110 VAC to 24 VDC, 220 VAC to 24 VDC, −48 VDC to 24 VDC; amplifiers in a variety of technologies, e.g., GaAs PD (power doubled), Si PD, Si PP (push pull), GaAs SE (single ended); and RF detector switches.

The passive modules preferably have cast metal housings with removable front covers and are provided with a cast guide rail on the top and bottom of the housing for mating with the slots in the upper and lower mounting brackets of the chassis. The passive modules are provided with a test point on the front cover for convenient access and may be provided with F, BNC or CamPort® connectors. The removable front cover on the amplifier module allows convenient access to plug-in pads, equalizers and filters in the amplifier circuitry with the module still installed in the chassis.

The active modules have sheet metal housings also with removable front covers. The active module housings may also be manufactured in a diecast format as well. Handles are mounted on the front covers of the active modules. Test points are also located on the front covers of the active and passive modules and the power supply module has an LED power indicator on the front cover. The power supply module is provided with a 24 VDC output on the rear of the module that facilitates "daisy-chain" powering between chassis in a rack.

The active modules are connected to the power bus by means of "floating" connectors mounted for resilient vertical movement to facilitate alignment of the module connector with one of the nine connectors mounted on the power bus. The active modules are provided with a pair of guide rails on the top and bottom of the module housing that mate with respective slot pairs in the upper and lower mounting brackets of the chassis.

Other objects, features and advantages of the present invention will become evident to one skilled in the art from the following detailed description of the invention in conjunction with the accompanying drawings.

DETAILED DESCRIPTION OF THE INVENTION

Figure 1:
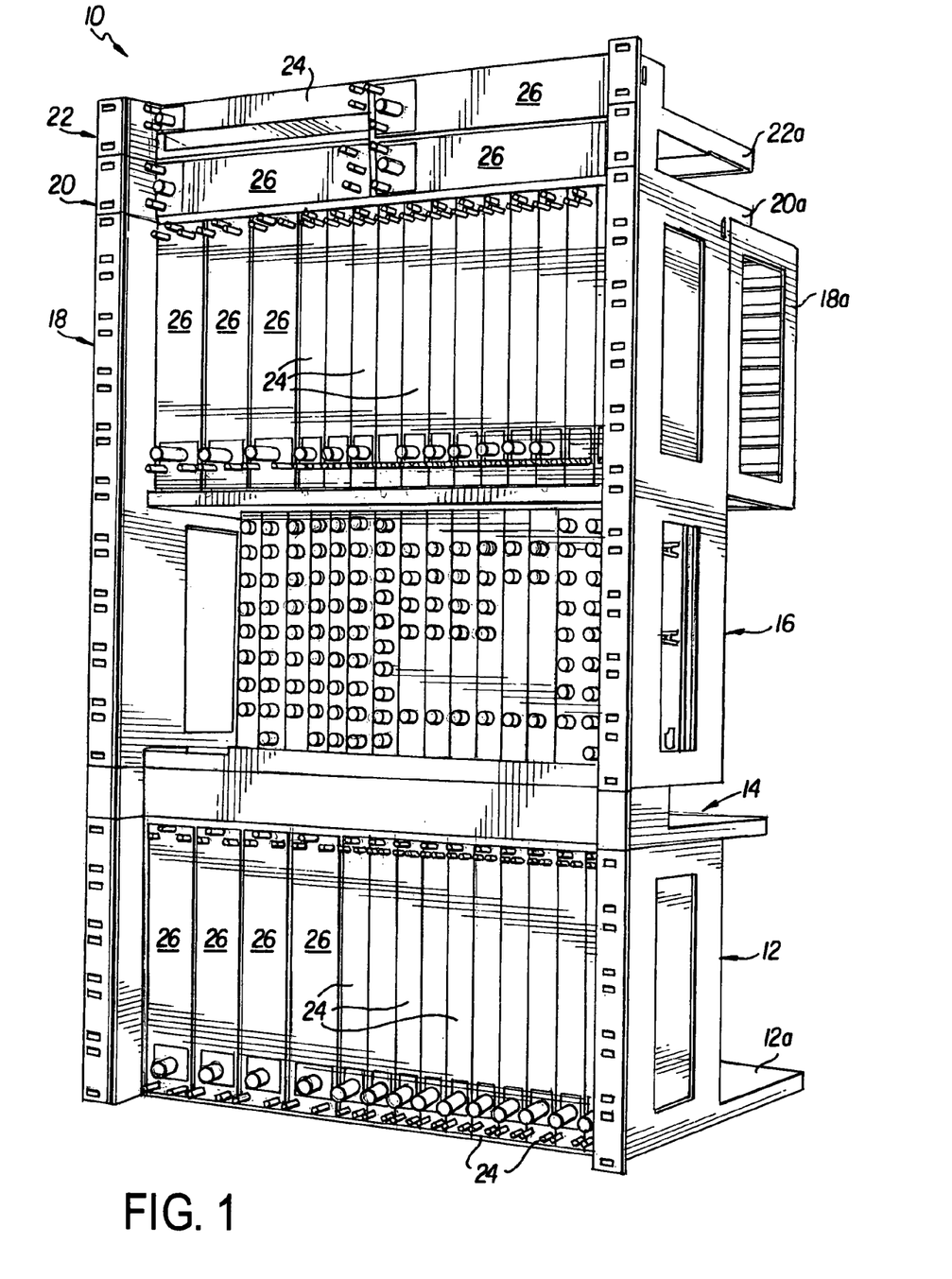
FIG. 1 is a front perspective view of the variously configured rack-mountable chassis of the present invention in a typical RF management system.
Figure 2:
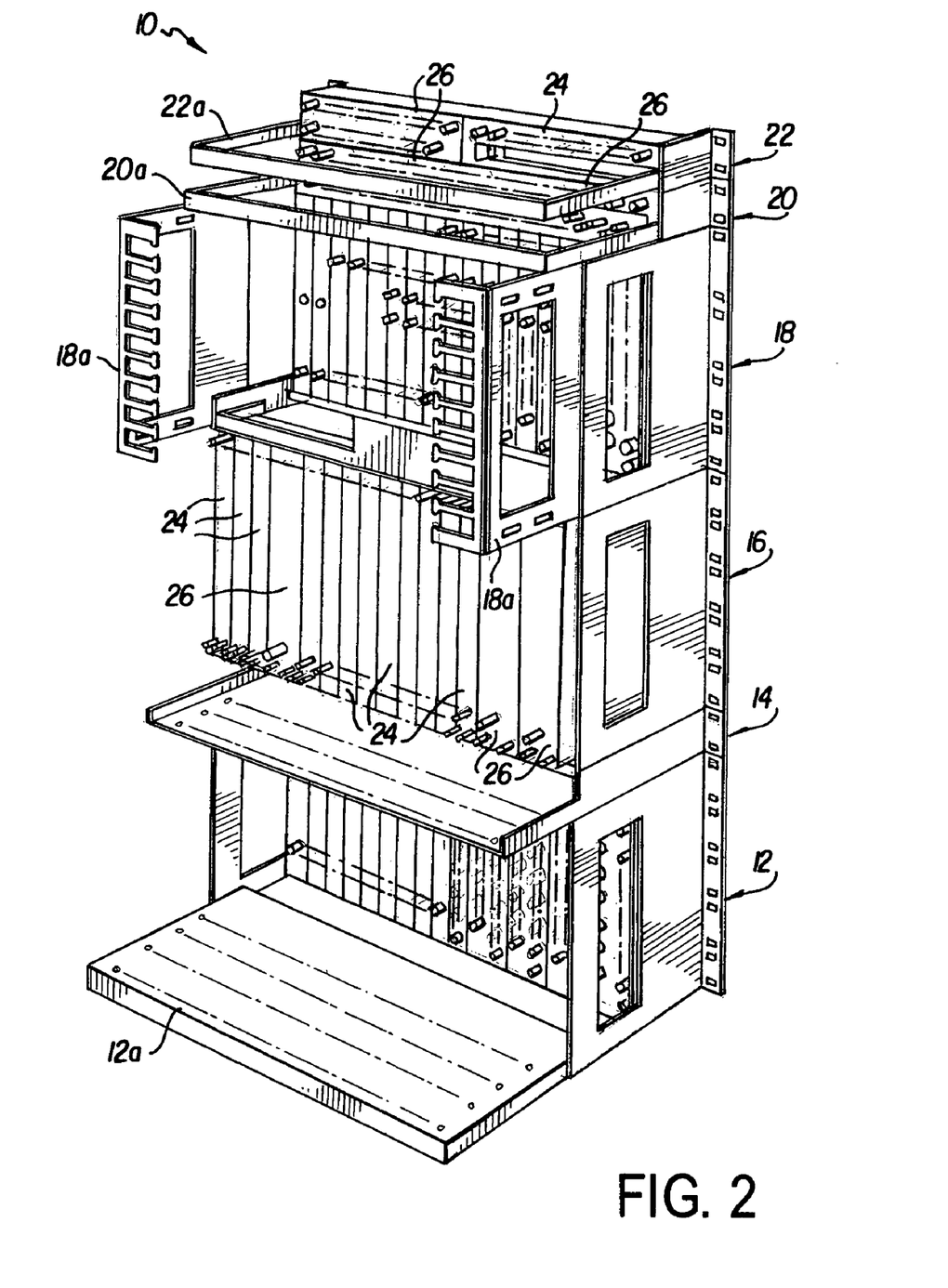
FIG. 2 is a rear perspective view of the chassis configurations of the RF management system of FIG. 1.

Referring now to the drawings in detail, FIGS. 1 and 2 illustrate front and rear perspective views of an RF management system comprising a typical arrangement 10 of passive RF circuit modules in a plurality of the rack mountable chassis of the present invention shown without cable connections for clarity. The arrangement 10 includes, from bottom to top, a 5 rack unit passive chassis 12 for vertically front mounted modules with a horizontal cable management tray 12a, a one rack unit slotted cable management tray 14, a 5 rack unit passive chassis 16 for vertically rear mounted modules, a 5 rack unit passive chassis 18 for vertically front mounted modules with cable management ears 18a, and two one rack unit passive chassis 20, 22 for horizontally front mounted modules with cable management bars 20a, 22a. Chassis 12 has eighteen module stations in which ten single station passive modules 24 and four double station passive modules 26 are front mounted. Chassis 16 has eighteen module stations in which twelve single station passive modules 24 and three double station passive modules 26 are rear mounted. Chassis 18 has eighteen module stations in which twelve single station passive modules 24 and three double station passive modules 26 are front mounted. Chassis 20 has four side-by-side module stations in which two double station passive modules 26 are front mounted and chassis 22 has four side-by-side module stations in which one single station passive module 24 and one double station passive module 26 are front mounted.

Figure 3:
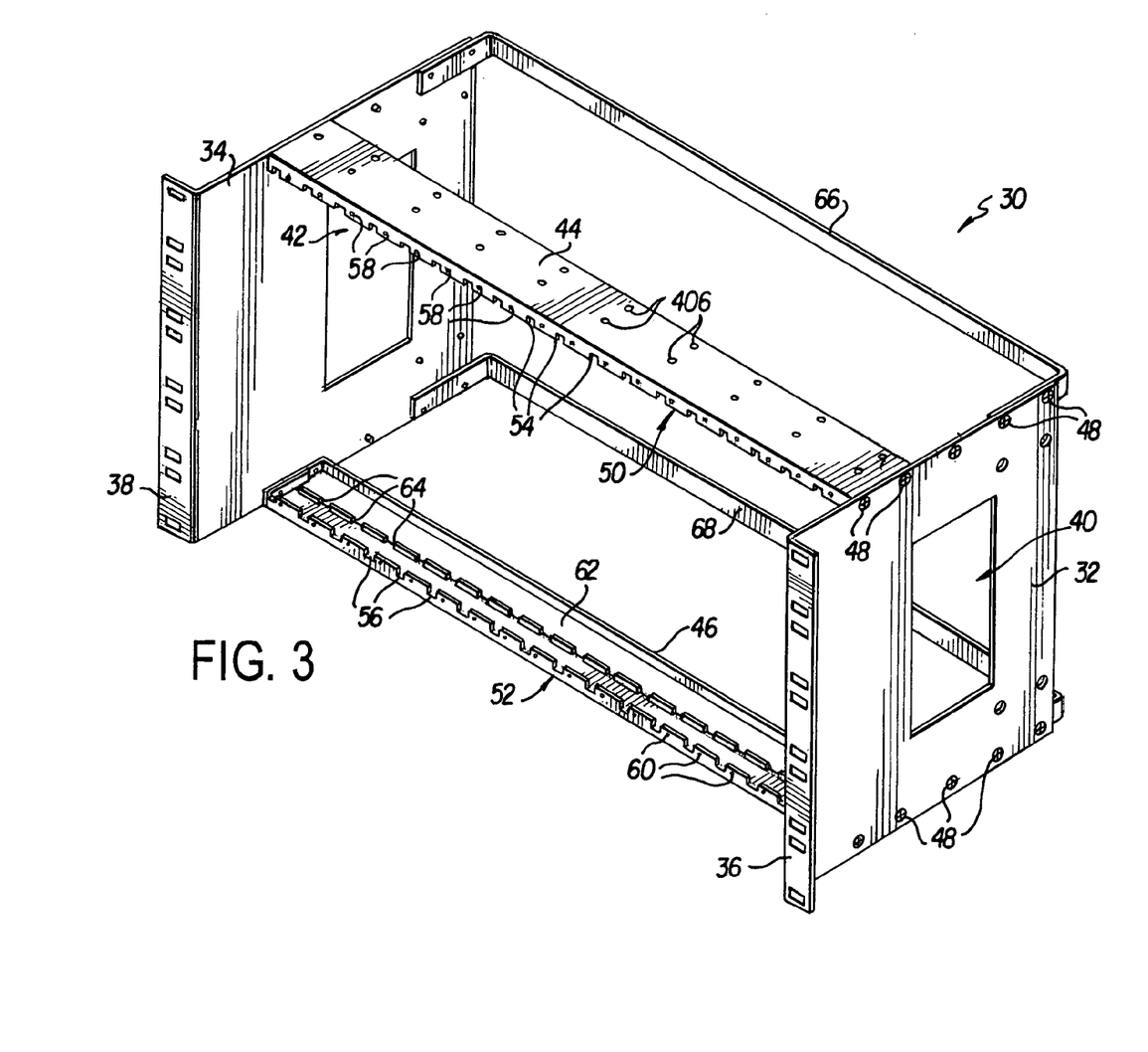
FIG. 3 is a front perspective view of a basic 5 rack unit active chassis of the present invention for front mounted vertical modules.

FIG. 3 illustrates a basic 5 rack unit chassis 30 of the invention for vertically front mounted active and passive modules, which is preferably made of a powder coated, heavy duty sheet steel. The chassis 30 comprises identical right and left side walls 32, 34 with rack mounting flanges 36, 38 extending perpendicularly outwardly from a respective side wall. The side walls are provided with large openings 40, 42 to facilitate air circulation through the chassis. Side walls 32, 34 are connected by upper and lower module mounting brackets 44, 46 using threaded fasteners 48.

Brackets 44, 46 are formed from identical, shallow U-shaped members. The forward depending edge 50 of the upper bracket 44 and the forward upstanding edge 52 of the lower bracket 46 are each provided with eighteen slots 54, 56 and eighteen threaded holes 58, 60 in vertical alignment for mounting up to eighteen single station passive RF modules or as many as nine double station active RF modules. The U-shaped member of the lower bracket 46 is provided with an insert 62 having a further series of eighteen slots 64 to aid in guiding the modules into their proper positions in the chassis 30. In a chassis configured to receive active modules, such as chassis 30, instead of the insert 62, the upper bracket 44 is provided on its underside with a planar power bus (not shown in FIG. 3), but described in more detail hereinafter in connection with the description of FIGS. 15 and 16. Thus, the U-shaped bracket members of the brackets 44, 46 may both be provided with inserts 62 for a passive module chassis and one bracket 44 may be provided with a power bus and the other with an insert 62 for an active module chassis.

Upper and lower identical support bars 66, 68 are connected by threaded fasteners 48 to the rear edges of the side walls 32, 34 to further strengthen the chassis. The basic chassis design is thus characterized by a simple, yet robust structure with a variety of different configurations to be described.

Figure 4:
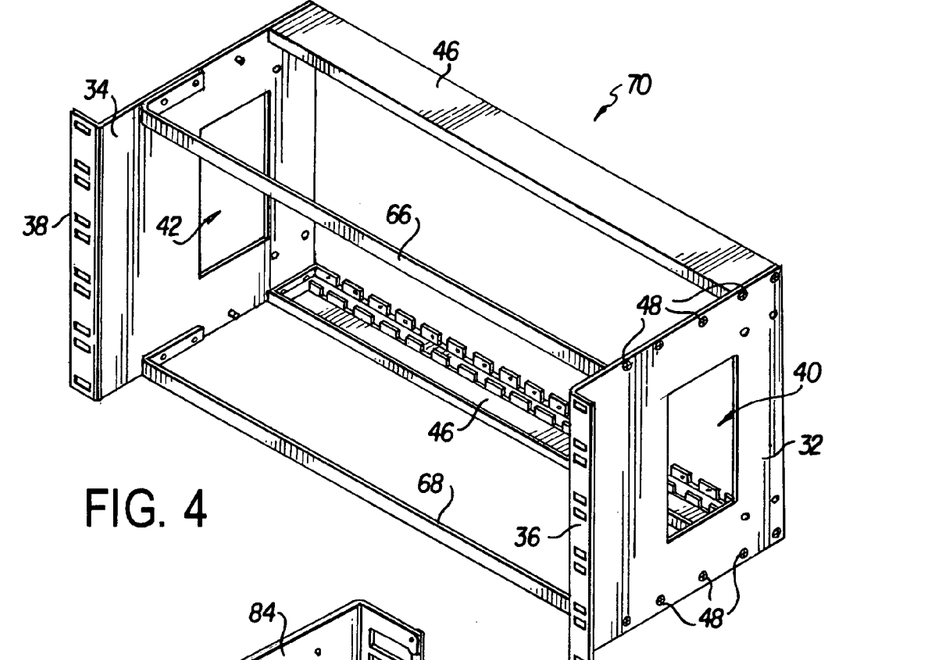
FIG. 4 is a front perspective view of a basic 5 rack unit passive chassis of the present invention for rear mounted vertical modules.

FIG. 4 illustrates a basic 5 rack unit chassis 70 configured for receiving rear mounted passive RF modules. The components of the chassis 70 include the same identical right and left side walls 32, 34 as the chassis 30. In this configuration, the side walls 32, 34 are connected at their upper and lower rear edges by a pair of identical brackets 46 with inserts 62 corresponding to the lower brackets 46 of the chassis 30 for rear mounting up to eighteen single station passive RF modules or nine double station passive RF modules or combinations of the two. The brackets 46 are provided with slots and threaded holes in the same manner as the bracket 46 used in connection with chassis 30 and are fastened to the side walls by threaded fasteners 48. Upper and lower support bars 66, 68 are connected by threaded fasteners 48 between the side walls 32, 34 to strengthen the chassis 70. It is to be noted that the connecting locations of the brackets 46 and the support bars 66, 68 of the chassis 70 have been switched with the connecting locations of the brackets 44, 46 and support bars 66, 68 of the chassis 30 shown in FIG. 3.

Figure 5:
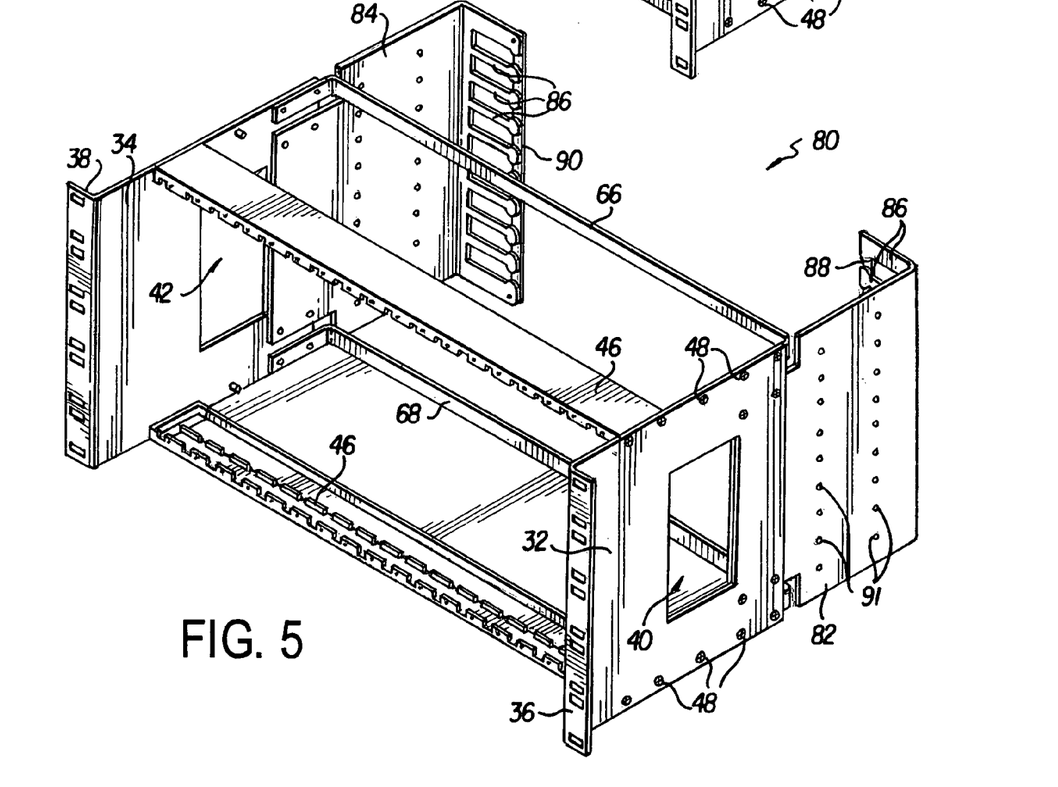
FIG. 5 is a front perspective view of a basic 5 rack unit passive chassis of the present invention for front mounted vertical modules with cable management ears mounted thereto.

FIG. 5 illustrates a basic 5 rack unit chassis 80 configured for receiving front mounted passive RF modules. The components of the chassis 80 include the same identical right and left side walls 32, 34 as the chassis 30 and 70. In this configuration, the side walls 32, 34 are connected at their upper and lower edges by a pair of identical brackets 46 corresponding to the lower brackets 46 of the chassis 30 for front mounting up to eighteen single station passive RF modules or nine double station passive RF modules or combinations of the two. The brackets 46 are provided with the same slots and threaded holes as the bracket 46 used in connection with chassis 30 and 70 and are fastened to the side walls by threaded fasteners 48. Upper and lower support bars 66, 68 are connected by threaded fasteners 48 between the side walls 32, 34 to strengthen the chassis 80.

In the FIG. 5 configuration, a pair of identical cable management ears 82, 84 comprising sheet steel plates are fastened by threaded fasteners 48 to the rear edges of the side walls 32, 34. Cable management ears 82, 84 have a plurality of inwardly directed fingers 86 between which cables (not shown) connected to the passive RF modules are directed. Cable security bars 88, 90 may be fastened to the free ends of the fingers 86 to manage and retain the cables in place. Ears 82, 84 are provided with a hole grid 91 for fastening standard cable tie wraps with push-mount buttons to facilitate cable management. It is to be noted that the chassis 80 corresponds to the basic 5 rack unit chassis 30 with a bracket 46 and insert 62 substituted for the upper power bar bracket 44 of the chassis 30.

Figure 6:
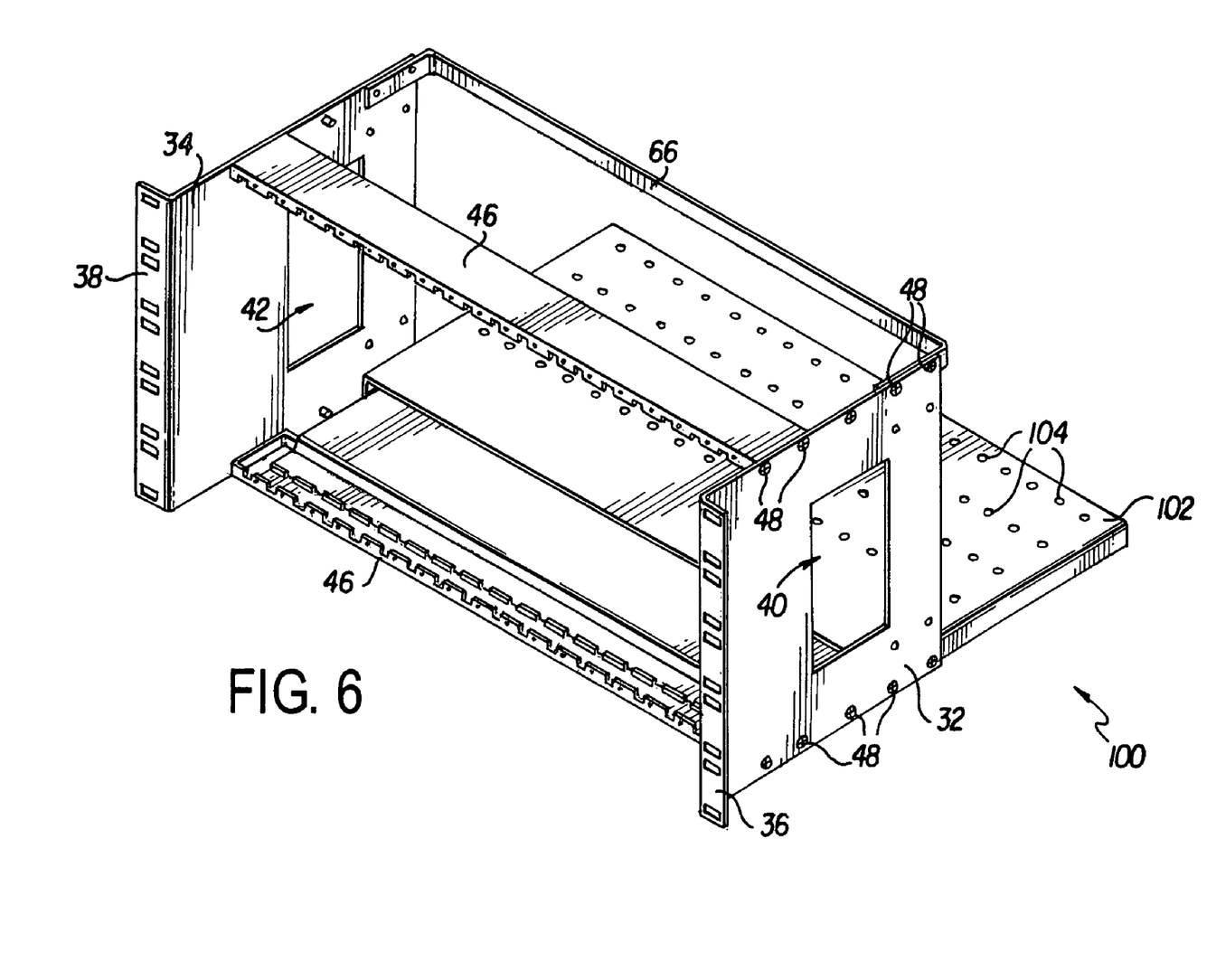
FIG. 6 is a front perspective view of a one rack unit slotted cable management tray of the invention.

FIG. 6 illustrates a basic 5 rack unit chassis 100 configured for receiving front mounted passive RF modules. The components of the chassis 100 include the same identical right and left side walls 32, 34 as the chassis 30, 70 and 80. In this configuration, the side walls 32, 34 are connected at their upper and lower edges by a pair of identical brackets 46 corresponding to the lower brackets 46 of the chassis 30 for front mounting up to eighteen single station passive RF modules or nine double station passive RF modules or combinations of the two. The brackets 46 are provided with the same slots and threaded holes as the bracket 46 used in connection with chassis 30 and 70 and are fastened to the side walls by threaded fasteners 48. Upper support bar 66 is connected by threaded fasteners 48 between the side walls 32, 34 of chassis 100. Instead of the lower support bar 68, a horizontal cable management tray 102 is connected between the side walls 32, 34 by fasteners 48. Tray 102 is provided with a hole grid 104 for fastening standard cable tie wraps with push-mount buttons to facilitate cable management.

Figure 7:
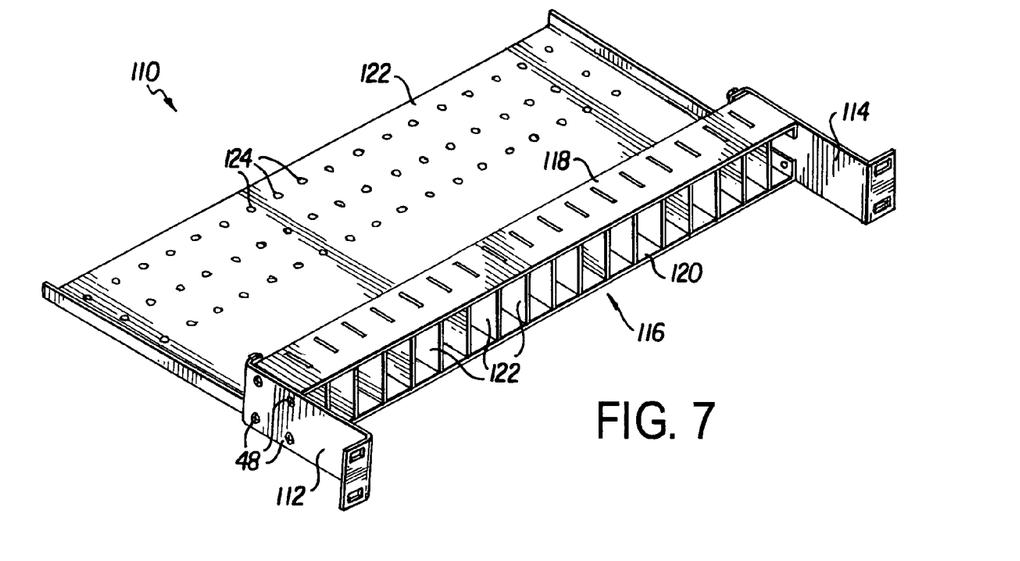
FIG. 7 is a cable management tray used in a standalone fashion or in conjunction with the basic rack unit passive chassis of the present invention for rear mounted vertical modules.

FIG. 7 illustrates a one rack unit slotted cable management tray 110 especially adapted for use with the chassis 70 in which passive RF modules are rear mounted. The tray 110 comprises a pair of side walls 112, 114 between which is connected by threaded fasteners 48 a slotted cable guide 116 formed of upper and lower connecting members 118, 120 and a plurality of spaced vertical members 122. A horizontal tray 122 having a hole grid 124 for fastening standard cable tie wraps with push-mount buttons to facilitate cable management.

Figure 8:
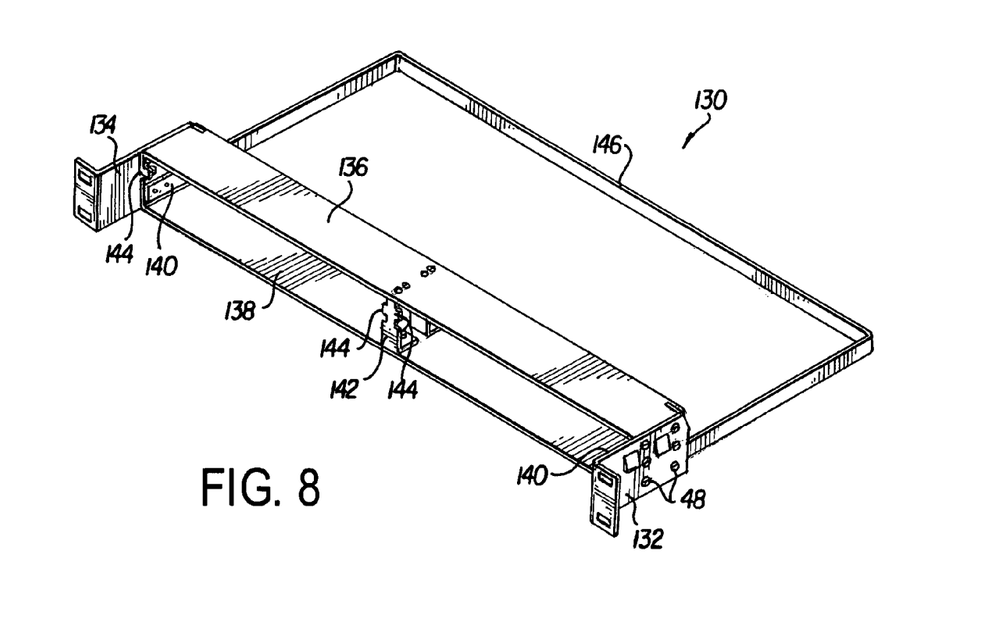
FIG. 8 is a front perspective view of a one rack unit passive chassis of the present invention for front mounted horizontal modules with a cable management bar mounted thereto.

FIG. 8 illustrates a one rack unit chassis 130 configured for receiving up to four single station, horizontally oriented passive RF modules or two double station, horizontally oriented passive RF modules (not shown). Chassis 130 comprises a pair of side walls 132, 134 between which are connected by threaded fasteners 48 upper and lower connecting members 136, 138. At the ends of the connecting members adjacent each side wall 132, 134 and in the center of the connecting members are provided slotted RF module mounting brackets 140, 142 with threaded holes 144 for accepting and securing the passive RF modules. A cable management bar 146 is connected to the rear of the chassis 130 by threaded fasteners 48.

Figure 9:
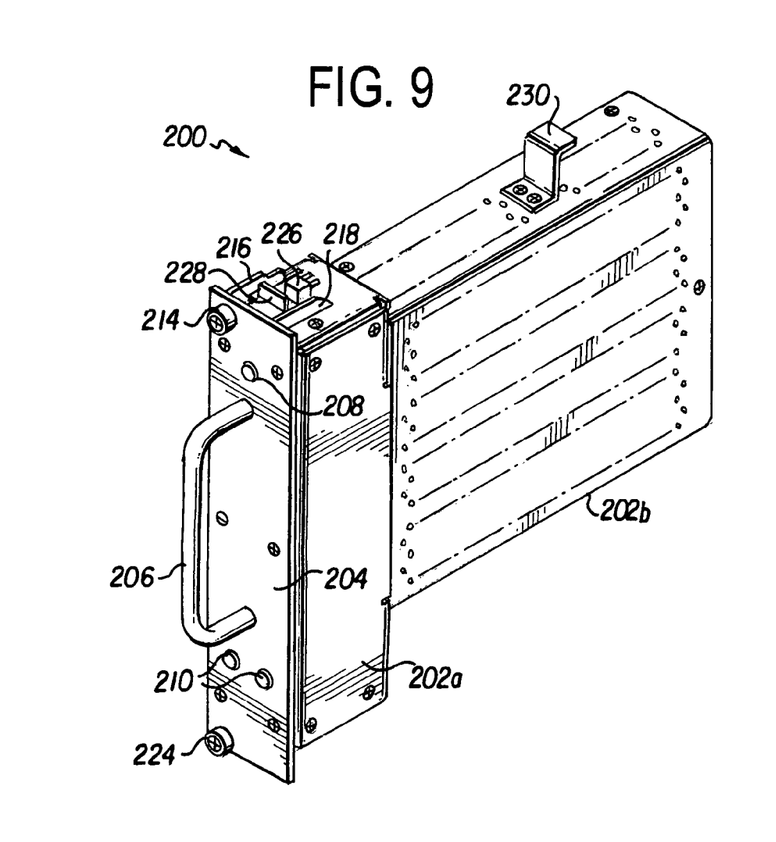
FIG. 9 is a front perspective view of an RF power supply module of the present invention.
Figure 10:
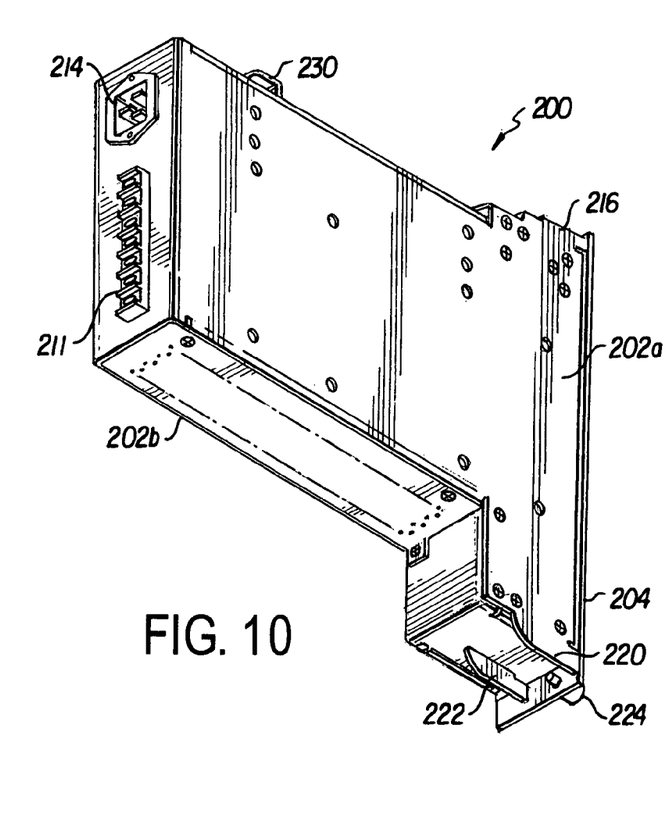
FIG. 10 is a rear perspective view of the RF power supply module of FIG. 9.

Illustrated in FIGS. 9 and 10 is an RF 24 VDC power supply (active) module 200 that is adapted to be front mounted in the 5 rack unit chassis 30 shown in FIG. 3. The power supply may be configured to supply 24 VDC from 110 VAC, 220 VAC or –48 VDC. Module 200 comprises a two-part housing 202a, 202b made of a sheet metal, such as aluminum, having a removable front cover 204 that is provided with a handle 206 to facilitate installation and removal of the module 200 from the chassis 30. The housing portion 202b is perforated for heat dissipation purposes. An LED power indicator 208 is mounted on the front cover 204 along with test points 210 for checking the 24 VDC output from terminal 211 on the rear cover 212 of the housing portion 202b. Input voltage (110 VAC, 220 VAC or –48 VDC) is supplied to the power supply via a conventional connector plug 214 mounted on the rear cover.

Housing 202a is provided on its top and bottom with two pair of guide rails 216, 218 and 220, 222 adapted to mate with respective slots 54, 56 in brackets 44, 46 of chassis 30. Captive, spring-biased thumbscrews 224 mounted on the front cover 204 are threaded into the threaded holes 58, 60 in the brackets 44, 46 of chassis 30 to securely fasten the module 200 in the chassis. A "floating" connector 226 (described in detail in connection with FIGS. 13 and 14) extends through the top of housing portion 202a between the guide rails 216, 218. Connector 226 is adapted to connect to one of the connectors of the power bus (FIGS. 15 and 16) mounted on the underside of bracket 44 to supply power to other active RF modules, e.g., amplifiers, mounted in the chassis 30. A connector guard 228 is mounted forwardly of the connector 226 to protect the connector 226 from damage when the module 200 is removed from the chassis 30. An L-shaped hanger 230 is attached to the top of housing portion 202b for engaging upper support bar 66 to provide additional support for the module 200.

The power supply may also have a terminal block located on its rear that can be configured to have 24 VDC output(s), 24 VDC or −48 VDC input(s), and status outputs (e.g., relay contact(s)) indicating the status of a monitored performance parameter such as voltage output or current.

Power supplies may also be configured to allow for load sharing redundant operation (i.e., two power supplies share the load requirements and in the event of one power supply failing the other supplies the entire load requirement).

Finally, the power supplies can be configured to monitor the status of the supply by monitoring the output voltage and/or current draw from the unit.

Figure 11:
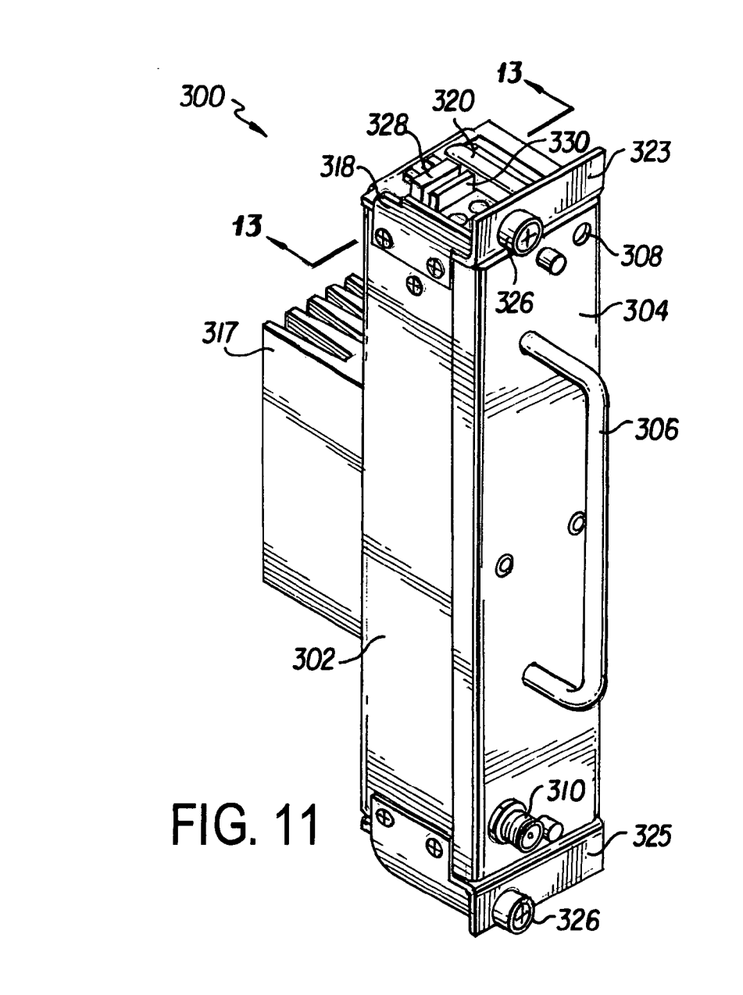
FIG. 11 is a front perspective view of an RF amplifier module of the present invention.
Figure 12:
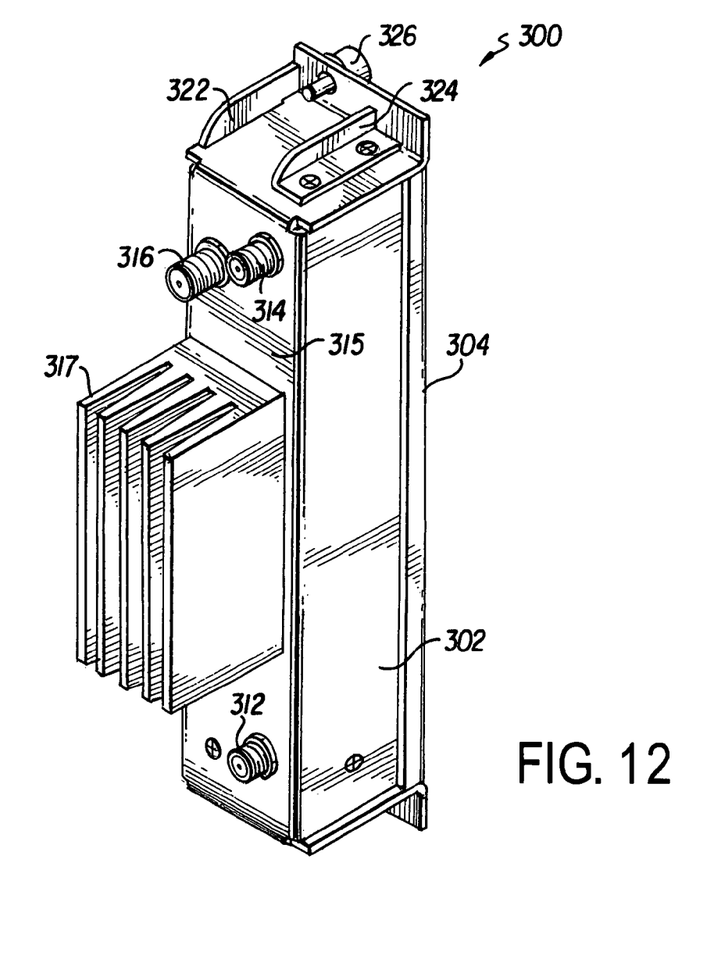
FIG. 12 is a rear perspective view of the RF amplifier module of FIG. 11.

Referring now to FIGS. 11 and 12 there is shown an RF amplifier module 300 adapted to be front mounted in the 5 rack unit active module chassis 30 shown in FIG. 3. Module 300 comprises a housing 302 made of a sheet metal, such as aluminum, or a cast material, having a removable front cover 304 that is provided with a handle 306 to facilitate installation and removal of the module 300 from the chassis 30. The removable front cover exposes the amplifier module circuitry and allows access to signal conditioning elements such as plug in attenuator pads or equalizers. An LED power indicator 308 is mounted on the front cover 304 along with a test point 310. An RF input 312, RF output 314 and an RF narrowcast input 316 may be located on the rear plate 315 of the housing 302, depending on the amplifier configuration. Front access test points or injection points (input or output test points) may protrude through the front cover. Also mounted on the rear plate 315 may be a heat sink/heat dissipater 317 that dissipates heat from the amplifier components in the housing.

Housing 302 is provided on its top and bottom with two pair of guide rails 318, 320 and 322, 324 adapted to mate with respective slots 54, 56 in brackets 44, 46 of chassis 30. Captive, spring-biased thumbscrews 326 mounted on upper and lower ears 323, 325 of housing 302 are threaded into the threaded holes 58, 60 in the brackets 44, 46 of chassis 30 to securely fasten the module 300 in the chassis. A "floating" connector 328 (described in detail in connection with FIGS. 13 and 14) extends through the top of housing 302 between the guide rails 318, 320. Connector 328 is adapted to connect to one of the connectors of the power bus (FIGS. 15 and 16) mounted on the underside of bracket 44 to supply power to the amplifier circuits enclosed in the housing 302. A connector guard 330 is mounted forwardly of the connector 328 to protect the connector 328 from damage when the module 300 is removed from the chassis 30.

Figure 13:
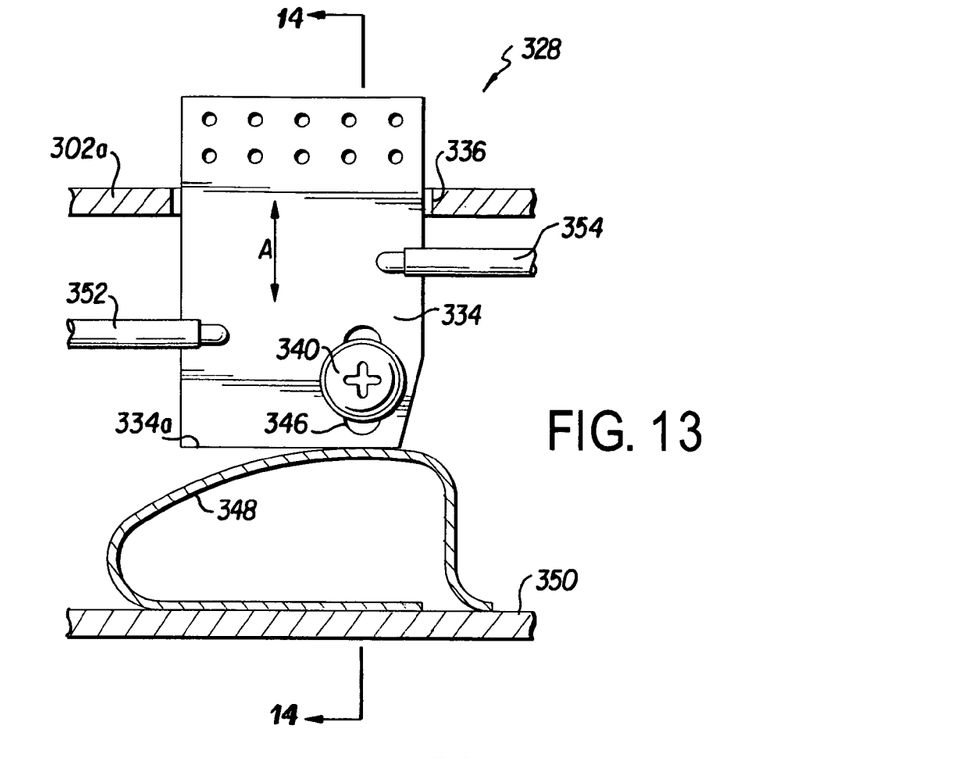
FIG. 13 is an enlarged cross sectional view of the "floating" power connection of the amplifier module taken along line 13-13 of FIG. 12.
Figure 14:
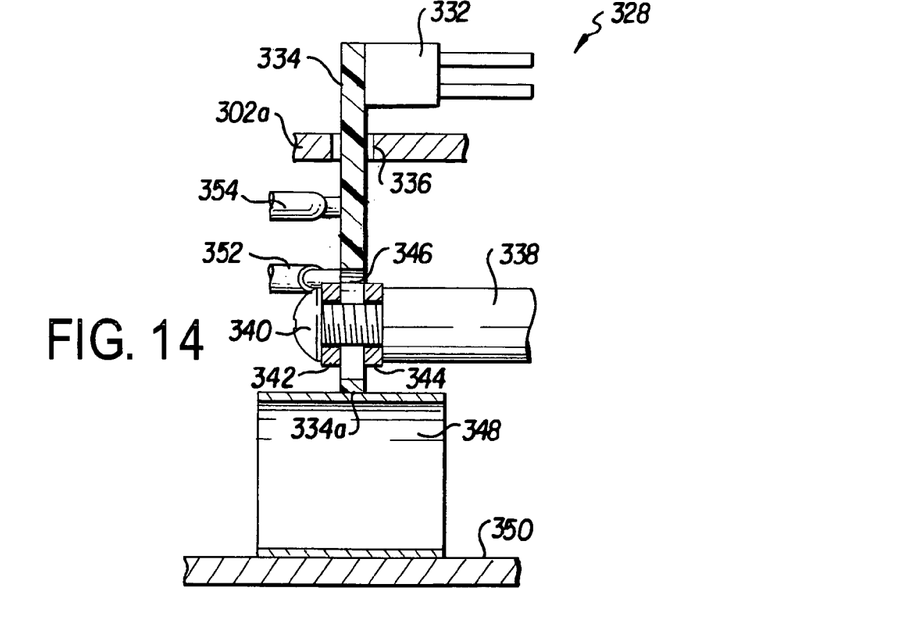
FIG. 14 is an enlarged cross sectional view of the "floating" power connection of the amplifier module taken along line 14-14 of FIG. 13.

FIGS. 13 and 14 illustrate in enlarged detail the "floating" connectors 226, 328 of the active RF modules 200 and 300 as viewed along line 13-13 of FIG. 11 and will be described with reference to connector 328, it being understood that the connector 226 is constructed identically to connector 328. Connector 328 comprises an 8-socket plug 332 electrically connected to a planar circuit board 334 that passes through a guide slot 336 in the top 302a of housing 302. Inside the housing 302, a fixed standoff 338 with an axially threaded hole in the end thereof is mounted to the rear plate 315 of the housing. A screw 340 may have a pair of low friction washers 342, 344 (e.g., nylon washers) thereon passes through a vertically elongated slot 346 in the circuit board 334 and is threaded into the hole in the end of the standoff 338 to support and guide the circuit board 334 for vertical reciprocating ("floating") movement as shown by the arrow A in FIG. 13. The lower end 344a of circuit board 334 bears on a generally C-shaped leaf spring 348 that is supported on a shelf 350 in the housing 302 and is arranged to resiliently support the circuit board 334 for "floating" movement.

The power supply circuits, amplifier circuits and other active circuits of the active modules in chassis 30 supply or receive power via the leads 352, 354 on circuit board 334 which electrically connect those circuits to the plug 332 of connectors 226, 328. For example, the power supply module 200 supplies 24 VDC to the power bus mounted to upper bracket 44 via the connector 226 and the amplifier module 300 receives 24 VDC from the power bus via connector 328.

Figure 15:
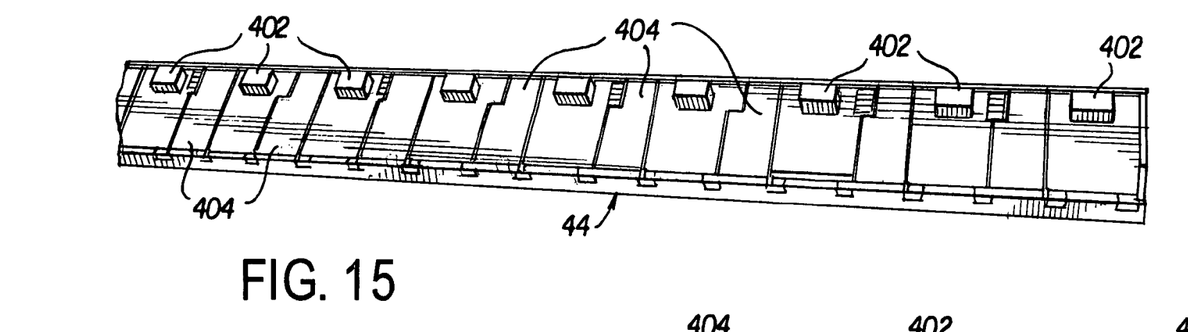
FIG. 15 is a perspective view of the power bus of the 5 rack unit active chassis of the present invention shown in FIG. 3.
Figure 16:
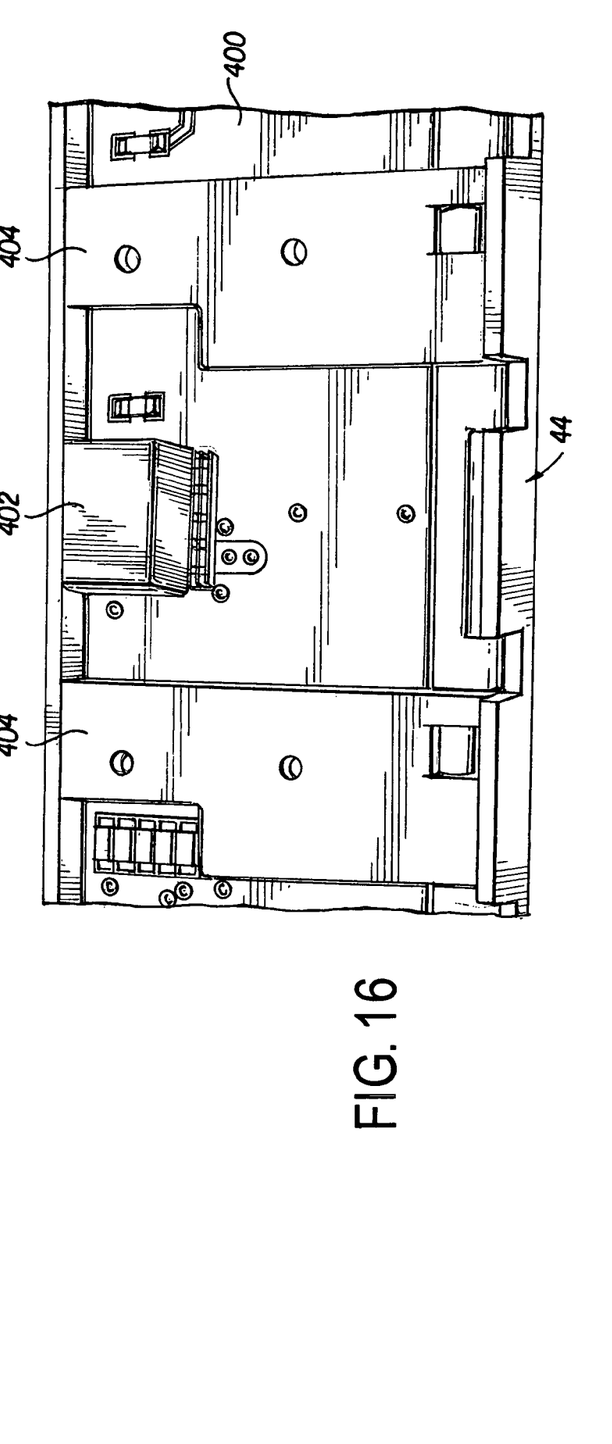
FIG. 16 is an enlarged perspective view of the detail of one of the 9 connectors of the power bus of FIG. 15.

Referring now to FIGS. 15 and 16, a planar power bus 400 made of a conventional circuit board material is shown mounted in the shallow, U-shaped member that forms the upper bracket 44 of the chassis 30. Attached to power bus 400 at evenly spaced intervals are a plurality (nine in the embodiment shown) of interconnected 8-pin plugs 402 which mate with the 8-socket plugs 332 of the connectors 226 and 328 of active modules 200 and 300. The power bus 400 is securely and rigidly held to the bracket 44 by a plurality of spaced plates 404 that are fastened to the circuit board material of the power bus and the bracket 44 by means of threaded fasteners 406 (FIG. 3).

In light of the foregoing description, it will be appreciated by those skilled in the art that the present invention provides a highly versatile RF management system that is characterized by a uniquely simple combination of chassis components that are designed to be configured in a plurality of combinations especially suited to use in the head end environment of a CATV system. Further, the system is provided with a unique "floating" connector for the active RF circuit modules.

Although certain presently preferred embodiments of the disclosed invention have been specifically described herein, it will be apparent to those skilled in the art to which the invention pertains that variations and modifications of the various embodiments shown and described herein may be made without departing from the spirit and scope of the invention. Accordingly, it is intended that the invention be limited only to the extent required by the appended claims and the applicable rules of law.

The invention claimed is:

1. A chassis system for use in mounting RF modules for an RF management system and having a plurality of chassis components adapted to be assembled into one of a plurality of different configurations, said chassis components comprising:

identical right and left side walls, each side wall having an opening therethrough and a flange for mounting the chassis to a rack;

identical upper and lower shallow U-shaped brackets adapted to connect the side walls in substantially parallel, spaced relation, each bracket having a plurality of spaced slots therein for mounting a plurality of RF modules between the brackets;

a support bar adapted to be connected between the side walls at a location spaced from the brackets; and fastener means for securing the plurality of RF modules to the brackets, wherein the opening on each of the side walls is large enough to dissipate heat generated by at least the plurality of RF modules by allowing an effective amount of air to circulate through the openings, wherein the opening of the right side wall and the opening of the left side wall are positioned substantially adjacent to a first slot and a last slot of the plurality of spaced slots, respectively, to enable air to flow between the opening of the right side wall, over the plurality of spaced slots, and the opening in the left sidewall.

2. The chassis system of claim 1, including an elongated planar power bus adapted to be connected to the upper bracket, said power bus having a plurality of electrically interconnected connectors mounted thereon in spaced relation for electrically connecting the power bus to at least some of the plurality of RF modules.

3. The chassis system of claim 1, including a plurality of active and passive RF modules mounted between the brackets.

4. The chassis system of claim 1, including cable management components comprising:
- cable management ears;
- a cable management tray; and
- a slotted cable management tray,
- wherein each cable management component includes a hole grid for fastening standard cable tie wraps, and wherein the cable management ears and the cable management tray are connectable between the side walls and wherein the slotted cable management tray is rack mountable adjacent a chassis.

5. The chassis system of claim 1, wherein the chassis components are made of powder coated sheet steel.

6. The chassis system of claim 2, wherein said lower bracket has an insert therein with a plurality of spaced slots aligned with the spaced slots in the lower bracket.

7. The chassis system of claim 2, wherein the different chassis configurations comprise:
- (a) a chassis for front loading active RF modules or active and passive RF modules, said chassis having left and right side walls, upper and lower brackets, the upper bracket having a power bus mounted thereon, and two support bars;
- (b) a chassis for front loading passive RF modules only, said chassis having left and right side walls, upper and lower brackets, the upper and lower brackets each having a slotted insert therein and two support bars; and
- (c) a chassis for rear loading passive RF modules only, said chassis having left and right side walls, upper and lower brackets, the upper and lower brackets each having a slotted insert therein and two support bars.

8. The chassis system of claim 4, wherein the cable management ears each comprise:
- a plate fastened to a rear edge of a respective side wall;
- a plurality of spaced fingers with free ends extending inwardly from each plate; and
- a cable security bar attached to the free ends of the fingers.

9. The chassis system of claim 4, wherein the slotted cable management tray comprises:
- a slotted cable guide having upper and lower connecting members; and
- a plurality of spaced vertical members mounted between the upper and lower connecting members.

10. The chassis system of claim 4, wherein the cable management tray is connected between the side walls in lieu of one of the support bars.

11. A system for mounting RF modules comprising:
- a first side wall;
- a second side wall spaced apart from the first side wall;
- an upper shallow U-shaped bracket adapted to be connected to the first and second side walls;
- a lower shallow U-shaped bracket spaced apart from and substantially parallel to the upper bracket and adapted to be connected to the first and second side walls such that the first and second side walls are substantially parallel, wherein each bracket has a plurality of spaced slots therein for mounting a plurality of RF modules between the brackets;
- a first support bar adapted to be connected between the first and second side walls at a location spaced from the brackets; and
- fastener means for securing the plurality of RF modules to the brackets,
- wherein the first and second side walls each includes at least one opening therethrough large enough to dissipate heat generated by the plurality of RF modules by allowing an effective amount of air to circulate through the at least one opening, wherein the at least one opening of the first side wall and the least one opening of the second side wall are positioned substantially adjacent to a first slot and a last slot of the plurality of spaced slots, respectively, to enable air to flow between the at least one opening of the first side wall, over the plurality of spaced slots, and the at least one opening in the second sidewall.

12. The system of claim 11, further comprising an elongated planar power bus adapted to be connected to the upper bracket, the power bus having a plurality of electrically interconnected connectors mounted thereon in spaced relation for electrically connecting the power bus to at least some of the plurality of RF modules.

13. The system of claim 11, wherein the plurality of RF modules includes at least one active and one passive RF module mounted between the brackets.

14. The system of claim 11, further comprising:
- cable management ears;
- a cable management tray; and
- a slotted cable management tray,
- wherein each of the cable management ears, the cable management tray and the slotted cable management tray includes a hole grid for fastening standard cable tie wraps, and wherein the cable management ears and the cable management tray are connectable between the side walls and wherein the slotted cable management tray is rack mountable adjacent a chassis.

15. The system of claim 12, further comprising:
- a second support bar,
- wherein the plurality of RF modules comprises at least one active RF module or at least one active and at least one passive RF module, and wherein the side walls, the brackets, the power bus, and the support bars form a chassis for front loading the at least one active RF module or the at least one active and the at least one passive RF module.

16. The system of claim 12, further comprising:
- a second support bar;
- a first slotted insert aligned with the spaced slots in the lower bracket;
- a second slotted insert aligned with the spaced slots in the upper bracket,
- wherein the plurality of RF modules comprises at least one passive RF module, and wherein the side walls, the brackets, the inserts, the power bus, and the support bars form a chassis for front loading the at least one passive RF module.

17. The system of claim 12, further comprising:
- a second support bar;
- a first slotted insert aligned with the spaced slots in the lower bracket;
- a second slotted insert aligned with the spaced slots in the upper bracket,
- wherein the plurality of RF modules comprises at least one passive RF module, and wherein the side walls, the brackets, the inserts, the power bus, and the support bars form a chassis for rear loading the at least one passive RF module.

* * * * *